(12) United States Patent
van der Heide

(10) Patent No.: US 10,903,045 B2
(45) Date of Patent: Jan. 26, 2021

(54) METHOD AND APPARATUS FOR ATOMIC PROBE TOMOGRAPHY

(71) Applicant: IMEC vzw, Leuven (BE)

(72) Inventor: Paul van der Heide, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/280,946

(22) Filed: Feb. 20, 2019

(65) Prior Publication Data

US 2019/0257855 A1    Aug. 22, 2019

(30) Foreign Application Priority Data

Feb. 21, 2018   (EP) .................................... 18157918

(51) Int. Cl.
  *H01J 37/285*   (2006.01)
  *H01J 37/22*   (2006.01)
(52) U.S. Cl.
  CPC .......... *H01J 37/285* (2013.01); *H01J 37/226* (2013.01); *H01J 2237/226* (2013.01); *H01J 2237/2852* (2013.01); *H01J 2237/2855* (2013.01)
(58) Field of Classification Search
  CPC ................... H01J 37/285; H01J 37/226; H01J 2237/2852; H01J 2237/2855; H01J 2237/226
  See application file for complete search history.

(56) References Cited

U.S. PATENT DOCUMENTS

| 9,899,197 | B2 * | 2/2018 | Sanford | ............... H01J 49/0027 |
| 10,153,144 | B2 * | 12/2018 | Sanford | .................. H01J 49/40 |
| 10,446,368 | B2 * | 10/2019 | Liddicoat | ............ H01J 49/0004 |
| 2011/0103681 | A1 | 5/2011 | Kelly | |

(Continued)

OTHER PUBLICATIONS

Farmand, Maryam et al., Near-edge X-ray refraction fine structure microscopy; Appl. Phys. Lett. 110, 063101 (2017).

(Continued)

*Primary Examiner* — Wyatt A Stoffa
(74) *Attorney, Agent, or Firm* — Knobbe Martens Olson & Bear, LLP

(57) ABSTRACT

The disclosed technology relates to a method and apparatus for atomic probe tomography (APT). The APT relates to the 3-dimensional reconstruction of the material of a sample having a free-standing tip, wherein an image is repeatedly obtained of the tip area through ptychography or ankylography, in the course of the APT analysis. In one aspect, imaging of the tip is achieved by directing a coherent light beam in the soft X-ray energy range at the tip during the APT analysis. The photons of the X-ray beam are not affected by the strong electric field around the tip, and thereby allow to determine the image of the tip through the application of a ptychography or ankylography algorithm to the data obtained from a photon detector. The photon detector is positioned to detect interference patterns created by photons which have interacted with the tip area, at different overlapping spots of the tip area, when the X-ray beam is scanned across a plurality of such overlapping areas. The method and apparatus allows real-time monitoring of the tip shape, as well as the feedback of the recorded tip shape in order to take tip deformations into account in the APT analysis.

20 Claims, 1 Drawing Sheet

(56) References Cited

U.S. PATENT DOCUMENTS

| | | | |
|---|---|---|---|
| 2011/0210245 A1* | 9/2011 | Deconihout | H01J 37/285 250/288 |
| 2012/0080596 A1* | 4/2012 | Vandervorst | H01J 37/285 250/307 |
| 2014/0070110 A1 | 3/2014 | Kitamoto et al. | |
| 2015/0060695 A1* | 3/2015 | Man | H01J 37/252 250/442.11 |
| 2017/0301526 A1 | 10/2017 | Sanford | |

OTHER PUBLICATIONS

Gorman, Brian P., Promises and Challenges of Atomic Scale Tomography; Department of Metallurgical and Materials Engineering, Colorado School of Mines; 2014.

Henry, Karen T., et al., Advances in Atom Probe Metrology; Cameca Science & Metrology Solutions; Apr. 15, 2015.

Hitchcock, Adam P., Soft X-ray spectromicroscopy and ptychography; Journal of Electron Spectroscopy and Related Phenomena 200 (2015) 49-63.

Kelly, Thomas F., et al., Atomic-Scale Topography: A 2020 Vision; Review Article in Microscopy and Microanalysis; Microsc. Microanal, 19, 652-664, 2013 doi:10.1017/S1431927613000494.

Koelling, S., et al., In-situ observation of non-hemispherical tip shape formation during laser-assisted atom probe tomography; Journal of Applied Physics 109, 104909 (2011).

Shapiro, David A., et al., Chemical composition mapping with nanometer resolution by soft X-ray microscopy; Nature Photonics, vol. 8; Oct. 2014.

Zhang, Boshen et al, Quantitative tabletop coherent diffraction imaging microscope for EUV lithography mask inspection, Dept. of Physics and JILA, University of Colorado; Metrology, Inspection and Process Control for Microlithography XXVUU; Proc. of SPIE vol. 9050 90501D1.

Extended European Search Report for Application No. 18157918.6; dated Sep. 19, 2018.

* cited by examiner

METHOD AND APPARATUS FOR ATOMIC PROBE TOMOGRAPHY

CROSS-REFERENCE TO RELATED APPLICATIONS

This application claims foreign priority to European Application EP 18157918.6, filed on Feb. 21, 2018, which is incorporated herein by reference in its entirety.

BACKGROUND

Technological Field

The disclosed technology relates to the solid state materials characterization technique known as Atom Probe Tomography (APT).

Description of the Related Technology

APT is a nano-scale 3-dimensional (3D) imaging technique in which each atom (including different isotopes of the same atom) within the solid of interest that is emitted through field evaporation from a specifically fabricated tip, and that reaches a 2-dimensional position-sensitive detector, is identified. Evaporation is usually triggered by a pulsed laser directed at the tip, while acceleration of the evaporated atoms takes place under the influence of a voltage difference between the tip and the detector. Under optimized conditions and on conductive samples, this technique allows to reconstruct nano-scale volumes in 3D to a resolution of 0.2 nanometer (nm), in the atomic scale. Applying APT to heterogeneous structures containing dielectrics, however tends to introduce severe distortions to the resulting 3D renditions. These stem primarily from APT tip shape modifications. An APT tip is assumed to be, and to remain, semi-hemispherical in shape during the course of the analysis. Any change to this shape results in distortions to the 3D reconstruction of the region that is under analysis by the APT technique. More precisely, the APT tip shape defines the shape of the electric field around the APT tip. This electric field controls the trajectories of atoms that are field evaporated from the sample. Any change in the trajectory of the evaporated atom will result in the aforementioned atom striking the 2D detector in a different location from the one expected from a semi-hemispherical tip. This effectively introduces distortions into the resulting 3D reconstructed volume.

Distortions of the APT tip shape are the result of differential evaporation rates occurring in heterogeneous structures. Presently known solutions to this problem center on the adjustment of the 3D data set, e.g. stretching out or compressing of this data set, such that the measured output matches the expected output. The expected output is either derived from prior knowledge of the structure examined, for example defined from literature, or from imaging of the APT tip prior to and or following APT analysis. These methods are however deficient in that they do not take into account the manner in which the deformation is taking place during the APT analysis.

SUMMARY OF CERTAIN INVENTIVE ASPECTS

One objective of some aspects of the disclosed technology aims to provide a method and apparatus which allow to solve the above-identified deficiency of the prior art. The disclosed technology relates to a method and apparatus as disclosed in the appended claims. The method and apparatus of the disclosed technology is configured to perform atomic probe tomography for the 3D reconstruction of the material of a sample having a free-standing tip, wherein an image is repeatedly obtained of the tip area through ptychography or ankylography, in the course of the APT analysis. This image is achieved by directing a coherent light beam in the soft X-ray energy range at the tip during the APT analysis. The photons of the X-ray beam are not affected by the strong electric field around the tip and thereby allow to determine the image of the tip. The image is determined by applying a ptychography or ankylography algorithm to the data obtained from a detector positioned to detect interference patterns created by photons from the X-ray beam which have interacted with the tip area at different overlapping spots of the tip area, when the X-ray beam is scanned across a plurality of such overlapping areas. The method and apparatus allows real-time monitoring of the tip shape, as well as the feedback of the recorded tip shape in order to take tip deformations into account in the APT analysis.

The disclosed technology more particularly relates to an apparatus for atomic probe tomography (APT) comprising a vacuum chamber; a sample holder for holding a sample inside the vacuum chamber, the sample having a free-standing tip; a 2-dimensional APT detector for detecting atoms evaporated from the tip; a voltage source for applying a voltage difference between the sample and the APT detector; and an APT processing tool for reconstructing the material of the tip based on the detected atoms, characterized in that the apparatus further comprises:

a beam nozzle for delivering a coherent photon beam into the vacuum chamber, the beam being directed at the tip and having a beam energy in the soft X-ray energy range;

a 2-dimensional photon detector positioned to detect photons from the X-ray beam which have interacted with the tip, wherein the beam nozzle is configured to permit or enable the scanning by the X-ray beam of adjacent and overlapping areas of the tip, and wherein the photon detector is configured to detect interference patterns generated by detected photons originating from the adjacent areas; and a data processing tool configured to apply a ptychography or ankylography algorithm to the detected interference patterns and to derive therefrom respectively a 2-dimensional or 3-dimensional image of the tip area.

According to an embodiment, the APT processing tool is configured to repeatedly receive an image of the tip area during an APT analysis, and to take into account deformations of the tip area exhibited by the repeatedly provided image.

The apparatus may further comprise a laser source for directing a pulsed laser beam at the tip area for triggering the evaporation. Alternatively, the nozzle may be configured to deliver an X-ray beam suitable for triggering the evaporation.

The apparatus of the disclosed technology may further comprise an apparatus for producing the coherent photon beam, wherein the apparatus is a High Harmonics Generator (HHG) source.

According to an embodiment, the photon detector is positioned opposite to the nozzle with respect to the longitudinal axis of the sample.

The disclosed technology further relates to a method of performing atomic probe tomography, comprising:

mounting a sample having a free-standing tip, in the sample holder in the vacuum chamber of an apparatus according to the disclosed technology;

under vacuum, evaporating atoms from the tip and projecting the atoms on the APT detector under the influence of a voltage applied between the sample and the APT detector; and reconstructing the material of the tip on the basis of the detected atoms, further comprising the following, executed repeatedly during the above evaporation and reconstruction:

scanning a number of adjacent and overlapping areas of the tip with a coherent light beam having a beam energy in the soft X-ray range;

detecting with the photon detector, interference patterns generated by detected photons from the X-ray beam, originating from the adjacent areas; and determining an image of the tip by applying a ptychography or ankylography algorithm to the interference patterns.

According to an embodiment of the disclosed technology, deformations of the tip area exhibited by the repeatedly provided images are taken into account in the reconstruction of the material of the tip on the basis of the detected atoms. According to an embodiment, the X-ray beam has a beam energy between 100 eV and 1 keV. The evaporation of the atoms may be triggered by a pulsed laser beam directed at the tip area or by a pulsed voltage applied to the tip.

The X-ray beam may be a pulsed beam, wherein X-ray pulses are generated between two consecutive laser pulses or voltage pulses.

According to an embodiment, the X-ray beam is applied only during the repeated scans of the adjacent and overlapping areas of the tip, and not in between consecutive scans.

According to an embodiment, the evaporation of atoms is triggered by the soft X-ray beam. In the latter case, the soft X-ray beam may be aimed at the apex of the sample tip, in between consecutive scans of the adjacent and overlapping areas of the tip. Also in the latter case, the X-ray beam may have a beam energy between 100 eV and 700 eV.

DETAILED DESCRIPTION OF CERTAIN ILLUSTRATIVE EMBODIMENTS

Figure 1:
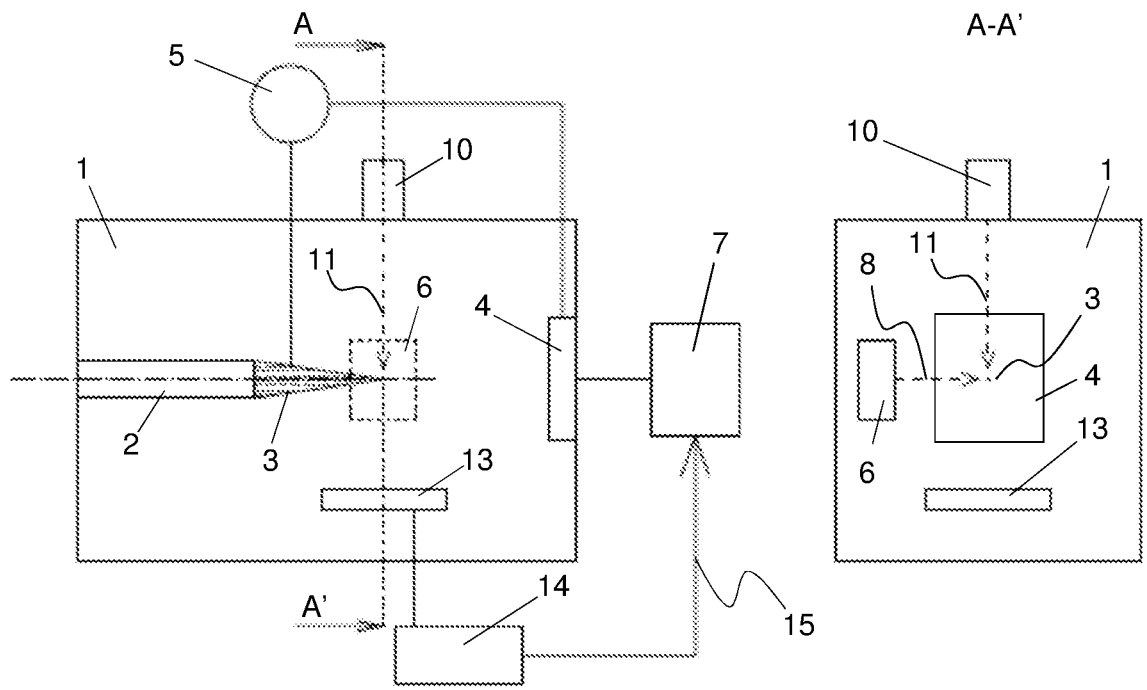
FIG. 1 shows the main components of an apparatus according to a first embodiment of the disclosed technology. It is a conceptual drawing that aims to clarify the disclosed technology. The components in question are not drawn on a realistic scale. The drawing includes a side view on the left hand side and a section view on the right hand side.

The apparatus of FIG. 1 comprises a vacuum chamber 1, containing a sample holder 2, onto which an APT (Atom Probe Tomography) sample 3 having a free-standing tip may be mounted. The sample tip radius is typically in the order of 100 nm. A 2-dimensional position sensitive detector 4 is placed facing the tip, and a DC voltage source 5 is coupled between the sample 3 and the detector 4. Within the present context of this specification and in the claims, the detector 4 will be termed an 'APT detector', in order to distinguish it from another detector type included in the apparatus and described later. A laser source 6 is further included, configured to direct a pulsed laser beam 8 at the tip, in order to trigger the evaporation of atoms from the surface of the tip. The pulsed laser light is typically in the energy range of a few eV. Atoms evaporated from the tip accelerate towards the APT detector 4 under the influence of the voltage applied by the voltage source 5. Atoms normally evaporate in the form of ions, but for the sake of consistency, the terms 'atoms' is used throughout the present description and claims. The apparatus further comprises an APT processing and imaging tool 7 configured to reconstruct the 3-dimensional structure of the tip on the basis of position and time-of-flight data of the atoms detected by the APT detector 4. The components described so far may be brought into practice in an apparatus according to the disclosed technology in the same manner as in an apparatus for atom probe tomography known in the art.

The apparatus of the disclosed technology further comprises a nozzle 10 for directing a coherent light beam 11 in the soft X-ray energy range towards the sample tip, inside the vacuum chamber 1. In an embodiment, the energy of the X-ray beam is between 100 eV and 1 keV. The soft X-ray beam is directed from the side at the tip area of the sample. In the embodiment shown in FIG. 1, the X-ray beam 11 is oriented perpendicularly to the laser beam 7 produced by the laser source 6. Other orientations are however possible. Furthermore, in the embodiment of FIG. 1, the X-ray beam 11 may be a pulsed X-ray beam, with pulses timed to fall in between two pulses of the laser. Other operational modes are however not excluded and some of these modes will be described in more detail later in this description.

The apparatus at least comprises the nozzle 10 or any equivalent means for delivering the X-ray beam 11 into the vacuum chamber 1. The X-ray source and additional components needed to guide the beam towards the nozzle 10 are not shown in FIG. 1. The source could be a synchrotron or it may be of smaller size such as a HHG (High Harmonics Generation) source, available today as a table top source, e.g. the XUUS4™ from KMLabs™. The use of a table top source enables the application of the method and apparatus of the disclosed technology in any laboratory environment. The table top source and beam guiding components may be included in the apparatus of the disclosed technology. In an embodiment, the source and beam guiding components are outside the vacuum chamber 1, but embodiments wherein these components are inside the vacuum chamber are not excluded.

Opposite the soft X-ray nozzle 10 with respect to the sample's longitudinal axis 12, a 2-dimensional photon detector 13 is mounted, configured to detect photons of the X-ray beam which have interacted with the tip and which are transmitted through the tip. This second detector 13 may be a CCD camera, for example. The photon detector 13 is not suitable for detecting atoms evaporated from the tip. Likewise, the APT detector 4 is not suitable for detecting photons originating from the X-ray beam 11. According to one embodiment, the nozzle 10 and the photon detector 13 are configured to enable the determination of a 2-dimensional side image of the tip through a technique known as ptychography. Ptychography is a coherent diffraction imaging technique that allows for a resolution close to the wavelength of the X-rays directed at the tip. The fact that the ptychography image is acquired through a photon beam is advantageous in that the trajectory of a photon is not affected by the strong electric field around the tip. This enables the taking of images of the tip during the APT analysis. In other words, the tip shape can be determined essentially in real time.

As is known in the art, ptychography requires the scanning of a region of interest by directing the beam at a series of overlapping spots. The complex interference patterns of the beams which have interacted with the sample at adjacent spots are captured by the photon detector 13, and a 2-D image of the scanned area is reconstructed through a phase retrieval algorithm. This technique is applied to the tip of the sample, for example through the scanning of the tip by directing a beam spot of 60 nm in diameter at adjacent 60 nm-diameter areas of the tip, wherein the spot is shifted horizontally or vertically in steps of 10 nm. These numbers are mere examples. The diameter of the spot must be significantly smaller than the tip radius. The shift must be smaller than the spot diameter, thereby resulting in overlapping spot areas. The nozzle 10 is configured to deliver a scanned beam into the vacuum chamber 1. The scanning as such is realized by a suitable means known in the art. This may involve the use of piezo-motors coupled to a Fresnel plate for focusing the beam onto the spot of, for example, 60 nm in diameter. These components could be incorporated in the nozzle 10 or be mounted upstream of the nozzle 10. The nozzle 10 is therefore the to be configured to permit or enable the scanning action.

The scanning of the tip requires a timespan that is a fraction of the time required for the APT analysis. Depending on the type of sample under investigation and the number of scanned areas, the scanning time may be in the order of seconds. The phase retrieval algorithm and imaging techniques used to construct a side image of the tip are known in the art and therefore not described here in detail. A data processing tool 14 in the form of a suitable calculation and imaging means known as such in the art for executing the algorithm and producing the image are included in the apparatus of the disclosed technology. The apparatus of FIG. 1 thus enables to repeatedly acquire a side image of the tip during the course of the APT analysis, which may itself take up to several hours. In this way, the shape of the tip may be monitored essentially in real time during the APT analysis.

Figure 2:
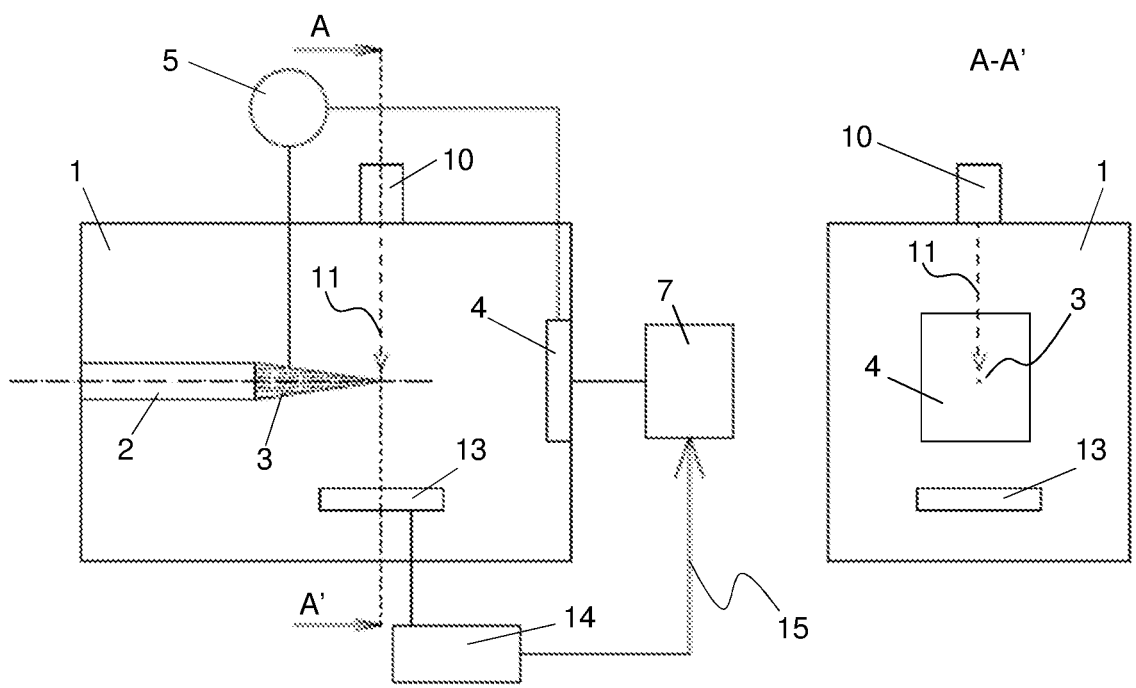
FIG. 2 illustrates, again as a conceptual drawing, an apparatus according to a second embodiment of the disclosed technology. Again a side view and a section view are shown on the left hand side and the right hand side respectively.

According to a second embodiment, illustrated in FIG. 2, the nozzle 10 for producing the soft X-ray beam 11 is provided in the apparatus, together with the photon detector 13 and the processing tool 14 for obtaining the ptychography image, but the low energy laser source is omitted. In this embodiment, the X-ray beam 11 is pulsed and configured both to trigger the evaporation of atoms from the sample 3 and to acquire the ptychography image. In this embodiment, the energy of the X-ray beam is chosen so as to enable the evaporation of atoms from the sample. Although the actual preferred beam energy may differ depending on the type of sample or other parameters, one embodiment favours the application, within the setup of FIG. 2, of a pulsed X-ray beam having a beam energy between 100 eV and 700 eV. Further embodiments within the setup of FIG. 2 apply X-ray beams having beam energy between 100 eV and 600 eV and between 100 eV and 500 eV.

As symbolized by the feedback arrows 15 in FIGS. 1 and 2, the APT processing tool 7 may be configured to receive the image produced by the ptychography processing tool 14, and to take into account detected deformations of the shape of the tip in the APT process, i.e. the APT process no longer assumes that the tip is perfectly semi-hemispherical but takes into account the measured shape of the tip, as determined by the ptychography technique. As stated above, the scanning of the tip and determination of the ptychography image takes a fraction of the time required for a full APT analysis. The feedback of the detected image can therefore take place multiple times during an APT analysis of several hours. In an embodiment, each consecutive image of the tip is taken into account in the respective subsequent step or steps of reconstructing the material of the tip on the basis of the detected atoms. Tip deformation is thereby directly incorporated in the APT process, in (quasi) real time.

As stated, various modes of operation may be implemented in an apparatus according to the first or second embodiment. In the first embodiment, when the laser pulses 8 alternate with the X-ray pulses 11 (i.e. one X-ray pulse between two consecutive laser pulses) the detection of evaporated atoms by the APT detector 4 and of photons by the photon detector 13 proceeds continuously, enabled by the fact that the photons are not influenced by the electric field around the tip and by the fact that the APT detector 4 does not detect photons while the photon detector 13 does not detect evaporated atoms. When a full scan of overlapping spots in the tip area by the X-ray is completed and a ptychography image is determined on the basis of this scan, the image may then be fed back to the APT tool 7, which may update the APT 3D reconstruction process on the basis of the acquired image. The X-ray beam may be configured to continuously scan the tip area so that the ptychography image is essentially available continuously throughout the APT process. As is clear to a person skilled in the art, the exact timing of the feedback loop must take into account the time required for performing a full scan and for running the ptychography algorithm.

In an alternative mode of operation, the laser 6 and the X-ray source operate by applying alternating series of pulses. For example, the X-ray source completes a scan of the tip area while the laser 6 is off. The ptychography image is determined and fed back to the APT tool which updates the APT process based on the obtained image. Then the laser 6 starts a series of pulses for triggering the evaporation of atoms and the APT acquisition proceeds during a given time. Then the laser is interrupted prior to acquiring another tip image which is again fed back for updating the APT tool, and so on. Further variations are possible: for example, the laser 6 may be active continuously, while the X-ray beam 11 may be active only during the scans. Instead of alternating the X-ray pulses with the laser pulses, both pulsed beams may also be synchronized.

Similarly, several modes of operation may be implemented in an apparatus according to the second embodiment illustrated in FIG. 2 (X-ray has double function of evaporating atoms and generating ptychography image). The detection of evaporated atoms by the APT detector 4 and of photons originating from the X-ray beam by the photon detector 13 may take place simultaneously. In addition to the fact that the photon detector 13 is not suitable for detecting evaporated atoms, these atoms are prohibited from reaching the photon detector 13 because of the electric field generated by the voltage source 5. Likewise, the photons from the X-ray beam 11 are not influenced by the electric field and will therefore not interfere with the APT detector 4. In any embodiment (also the ones including a laser 6), to diminish the influence of any secondary neutral detection, a bend may be imposed on the evaporated atom trajectory, as is known per se from the SIMS technology (Secondary Ion Mass Spectroscopy). When the evaporated atom detection and the photon detection proceed simultaneously in the embodiment of FIG. 2, the image obtained by ptychography may be fed back at repeated intervals to the APT tool 7, in the same manner as described above for the first embodiment. The X-ray beam 11 may be continuously scanned across overlapping spots of the tip area so that ptychography images are available essentially continuously during the process. Alternatively, scanning the tip area may take place repeatedly but at given instants in time during the APT analysis. When a scan is completed, the X-ray beam 11 may then be aimed at the tip apex in order to facilitate the evaporation of atoms in an optimal way. Possibly in the latter case, the APT detector 4 may be turned off during the X-ray scans, and the photon detector 13 may be turned off during the time intervals wherein the X-ray beam 11 is aimed at the tip apex. Feedback of the ptychography image and updating the APT tool 7 then takes place between two consecutive scans.

According to a third embodiment (not shown), applicable only to conductive samples, the apparatus is the same as the one illustrated in FIG. 2, but the evaporation is triggered by applying a pulsed voltage to the sample, in addition to the DC voltage difference applied by the voltage source 5, between the sample and the APT detector 4. Various modes of operation are again applicable to this third embodiment, similar to the modes described above for the first and second embodiment. For example, the voltage pulses may be generated alternatingly with the X-ray pulses, or the voltage pulses could be interrupted when the X-ray pulses are applied. While the various modes of operation described for the three embodiments of the apparatus differ in the above-described way, they are all examples of monitoring the tip 'essentially in real time during the APT analysis'.

The apparatus may comprise more than one pair of a nozzle 10 and a photon detector 13 for obtaining an image by ptychography. Such an embodiment allows to determine 2-dimensional side images of the tip from different angles, which leads to a more accurate determination of the tip shape deformation taking place during APT analysis.

According to an alternative embodiment, the data processing tool 14 is configured to perform an ankylography algorithm instead of a ptychography algorithm. Ankylography is a recently developed technique which enables to derive a 3D image of a sample from the interference patterns detected by the photon detector 13. The technique is described in a number of publications, such as "Three-dimensional structure determination from a single view", Raines et al, Nature, vol. 463 (January 2010), p. 214-217. Another reference on the subject of ankylography is "Three-dimensional imaging of a phase object from a single sample orientation using an optical laser", Chien-Chun Chen et al. Physical Review, B 84, 224104 (2011). The above descriptions of various embodiments of the apparatus as well as of the various modes of operation apply to the use of ankylography as well as ptychography.

Aspects of the method of the disclosed technology as disclosed in the appended claims have been mentioned already above in the description of an apparatus of the disclosed technology. The method comprises:
  mounting a sample 3 having a free-standing tip in the sample holder 2 in the vacuum chamber 1 of an apparatus according to the disclosed technology, for example, as illustrated in FIG. 1 or 2;
  evaporating atoms from the tip and projecting the atoms on the APT detector 4 under the influence of a voltage applied 5 between the sample 3 and the APT detector 4. Evaporation may be triggered by a laser as in FIG. 1, or by the X-ray beam itself, as in FIG. 2, or by a pulsed voltage applied to the tip. According to an exemplary embodiment in accordance with FIG. 2, the energy of the X-ray beam is between 100 eV and 700 eV; and
  reconstructing the material of the tip on the basis of the detected atoms, by a known APT calculation process based on the recorded position and time-of-flight of the detected atoms.

The method further comprises, at repeated times during the above evaporation process:
  scanning a number of adjacent and overlapping areas of the tip with a coherent light beam 11 having a beam energy in the soft X-ray range. For example, 60 nm diameter spots scanned in steps of 10 nm as described above;
  detecting with the photon detector 13, interference patterns generated by detected photons from the X-ray beam, originating from the adjacent areas; and
  determining an image of the tip by applying a ptychography or ankylography algorithm to the interference patterns.

In an embodiment, the method comprises a feedback step each time an image is acquired through ptychography or ankylography, so that the APT analysis takes into account tip deformations detected through the acquired images of the tip. The soft X-ray beam 11 applied in the method may have a beam energy between 100 eV and 1 keV. Further embodiments of the method apply an energy of the X-ray beam 11 between 200 eV and 800 eV, between 300 eV and 700 eV and between 400 eV and 600 eV.

Any of the above-described modes of operation applicable in the various embodiments of the apparatus of the invention represent specific embodiments of the method of the invention.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. An apparatus for reconstructing the material of a free-standing tip in atomic scale based on atomic probe tomography (APT), comprising:
  a vacuum chamber;
  a sample holder for holding a sample inside the vacuum chamber, the sample having the free-standing tip;
  a 2-dimensional APT detector for detecting atoms evaporated from the tip;
  a voltage source for applying a voltage difference between the sample and the APT detector;
  a beam nozzle for delivering a coherent photon beam into the vacuum chamber, the beam being directed at the tip and having a beam energy in the soft X-ray energy range;
  a 2-dimensional photon detector positioned to detect photons from the soft X-ray beam which have interacted with the tip, wherein the beam nozzle is configured to permit or enable the scanning by the soft X-ray beam of adjacent and overlapping areas of the tip, and wherein the photon detector is configured to detect interference patterns generated by detected photons originating from the adjacent areas; and a data processing tool configured to apply a ptychography or ankylography algorithm to the detected interference patterns and to derive therefrom a 2-dimensional or a 3-dimensional image of the tip area, respectively.

2. The apparatus according to claim 1, wherein the data processing tool is configured to repeatedly provide images of the tip area during an APT analysis, and wherein reconstructing the material of the tip takes into account deformations of the tip area exhibited by the repeatedly provided images.

3. The apparatus according to claim 2, further comprising a laser source for directing a pulsed laser beam at the tip area for triggering the evaporation.

4. The apparatus according to claim 2, wherein the nozzle is configured to deliver the soft X-ray beam suitable for triggering the evaporation.

5. The apparatus according to claim 1, further comprising a laser source for directing a pulsed laser beam at the tip area for triggering the evaporation.

6. The apparatus according to claim 1, wherein the nozzle is configured to deliver the soft X-ray beam suitable for triggering the evaporation.

7. The apparatus according to claim 1, further comprising an apparatus for producing the coherent photon beam, wherein the apparatus is a High Harmonics Generator (HHG) source.

8. The apparatus according to claim 1, wherein the photon detector is positioned opposite to the nozzle with respect to the longitudinal axis of the sample.

9. A method of performing atomic probe tomography using an apparatus, wherein the apparatus comprises:
   a vacuum chamber;
   a sample holder for holding a sample inside the vacuum chamber, the sample having a free-standing tip;
   a 2-dimensional APT detector for detecting atoms evaporated from the tip;
   a voltage source for applying a voltage difference between the sample and the APT detector;
   a beam nozzle for delivering a coherent photon beam into the vacuum chamber, the beam being directed at the tip and having a beam energy in the soft X-ray energy range;
   a 2-dimensional photon detector positioned to detect photons, wherein the beam nozzle is configured to permit or enable the scanning by the soft X-ray beam of the tip; and
   a data processing tool configured to derive a 2-dimensional or a 3-dimensional image of the tip area, and wherein the method comprises:
   mounting the sample in the sample holder in the vacuum chamber;
   under vacuum, evaporating atoms from the tip and projecting the atoms on the APT detector under the influence of the voltage difference applied between the sample and the APT detector;
   reconstructing the material of the tip on the basis of the detected atoms; and
   further comprising the following, executed repeatedly during the above evaporation and reconstruction:
   scanning a number of adjacent and overlapping areas of the tip with the coherent photon beam;
   detecting with the photon detector, interference patterns generated by the detected photons from the soft X-ray beam which have interacted with the tip, originating from the adjacent areas; and
   determining the image of the tip area by applying a ptychography or ankylography algorithm to the interference patterns.

10. The method according to claim 9, wherein the data processing tool is configured to repeatedly provide images of the tip area during an APT analysis, and wherein deformations of the tip area exhibited by the repeatedly provided images are taken into account in the reconstruction of the material of the tip on the basis of the detected atoms.

11. The method according to claim 10, wherein the soft X-ray beam has a beam energy between 100 eV and 1 keV.

12. The method according to claim 9, wherein the soft X-ray beam has a beam energy between 100 eV and 1 keV.

13. The method according to claim 9, wherein the evaporation of the atoms is triggered by a pulsed laser beam directed at the tip area or by a pulsed voltage applied to the tip.

14. The method according to claim 13, wherein the soft X-ray beam is a pulsed beam comprising a plurality of soft X-ray pulses and wherein the soft X-ray pulses are generated between two consecutive laser pulses or voltage pulses.

15. The method according to claim 14, wherein the soft X-ray beam is applied only during the repeated scans of the adjacent and overlapping areas of the tip, and not in between consecutive scans.

16. The method according to claim 13, wherein the soft X-ray beam is applied only during the repeated scans of the adjacent and overlapping areas of the tip, and not in between consecutive scans.

17. The method according to claim 9, wherein the evaporation of atoms is triggered by the soft X-ray beam.

18. The method according to claim 17, wherein the soft X-ray beam is aimed at the apex of the sample tip, in between consecutive scans of the adjacent and overlapping areas of the tip.

19. The method according to claim 18, wherein the soft X-ray beam has a beam energy between 100 eV and 700 eV.

20. The method according to claim 17, wherein the soft X-ray beam has a beam energy between 100 eV and 700 eV.

* * * * *